(12) United States Patent
Wan et al.

(10) Patent No.: US 10,183,858 B2
(45) Date of Patent: Jan. 22, 2019

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Albert Wan, Hsinchu (TW); Yu-Sheng Hsieh, New Taipei (TW); Chao-Wen Shih, Hsinchu County (TW); Shou Zen Chang, Taipei County (TW); Chung-Shi Liu, Hsinchu (TW); Chen-Hua Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/455,791

(22) Filed: Mar. 10, 2017

(65) Prior Publication Data

US 2018/0148317 A1    May 31, 2018

Related U.S. Application Data

(60) Provisional application No. 62/427,710, filed on Nov. 29, 2016.

(51) Int. Cl.
*B81B 7/00* (2006.01)
*B81C 1/00* (2006.01)
*B81C 99/00* (2010.01)

(52) U.S. Cl.
CPC ............ *B81B 7/007* (2013.01); *B81C 1/0023* (2013.01); *B81C 1/00301* (2013.01); *B81C 99/005* (2013.01); *B81B 2207/096* (2013.01)

(58) Field of Classification Search
CPC .......................... B81B 7/007; B81C 1/00301
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,553,062 B1 * | 1/2017 | Fan | H01L 24/08 |

(Continued)

*Primary Examiner* — Victor A Mandala
(74) *Attorney, Agent, or Firm* — WPAT, P.C., Intellectual Property Attorneys; Anthony King

(57) ABSTRACT

The present disclosure provides a semiconductor structure includes a sensing element configured to receive a signal from a sensing target, a molding surrounding the sensing element, a through via in the molding, a front side redistribution layer disposed at a front side of the sensing element and electrically connected thereto, and a back side redistribution layer disposed at a back side of the sensing element, the front side redistribution layer and the back side redistribution layer are electrically connected by the through via. The present disclosure also provides a method for manufacturing the semiconductor structure described herein.

20 Claims, 21 Drawing Sheets

(56) References Cited

U.S. PATENT DOCUMENTS

| | | | |
|---|---|---|---|
| 2009/0102002 A1* | 4/2009 | Chia | H01L 27/14618 257/433 |
| 2014/0361387 A1* | 12/2014 | Meyer | H01L 24/19 257/415 |
| 2016/0071779 A1* | 3/2016 | Chen | H01L 21/31 257/787 |
| 2016/0347606 A1* | 12/2016 | Bruno | B81B 7/0058 |
| 2017/0249493 A1* | 8/2017 | Yu | G06K 9/0004 |
| 2017/0357838 A1* | 12/2017 | Chen | G06K 9/0002 |
| 2018/0012851 A1* | 1/2018 | Liu | H01L 23/66 |
| 2018/0012863 A1* | 1/2018 | Yu | G06K 9/00006 |

\* cited by examiner

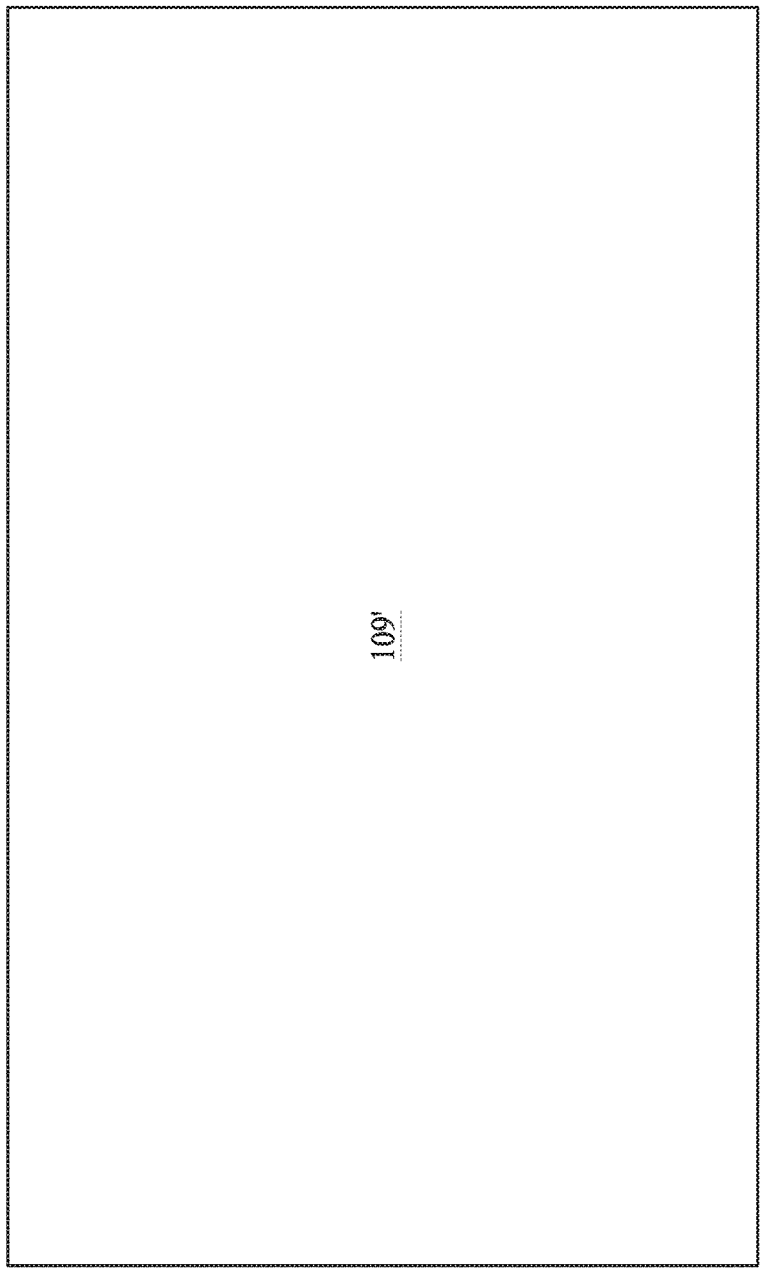

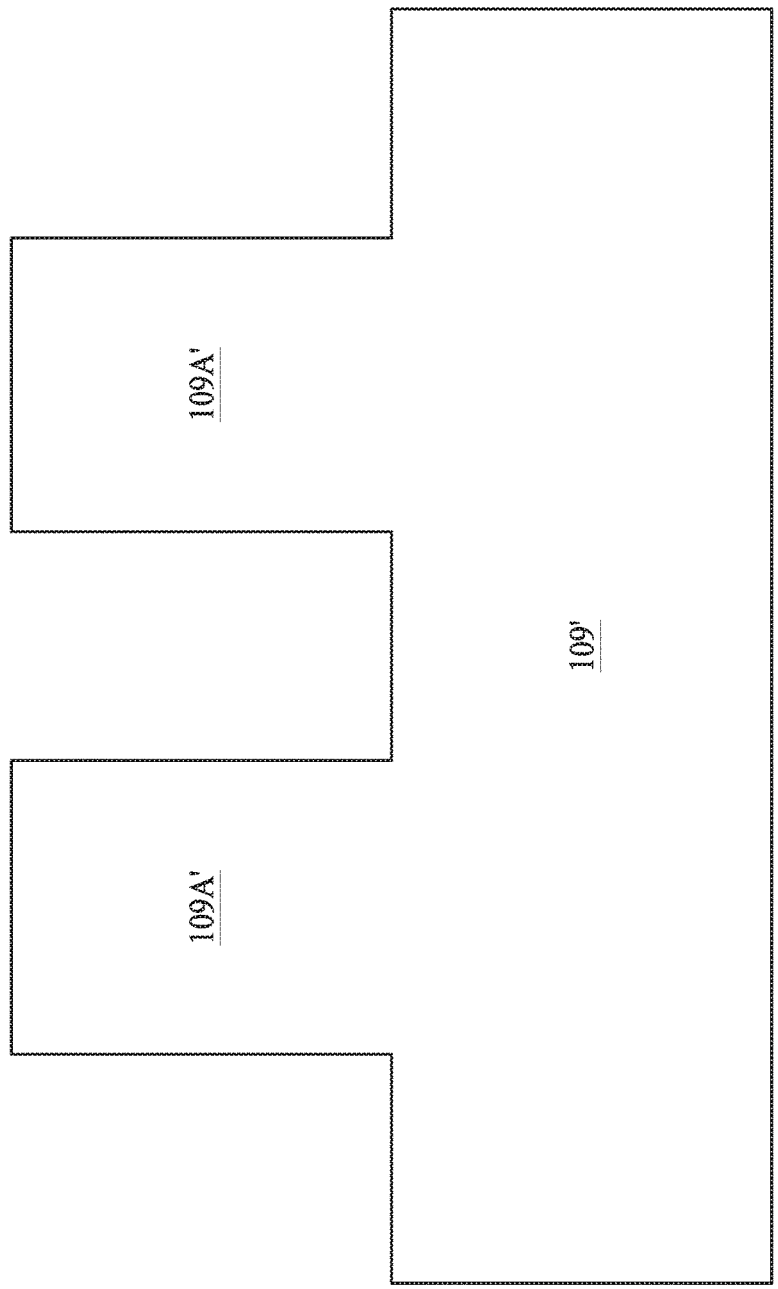

SEMICONDUCTOR STRUCTURE AND METHOD OF MANUFACTURING THE SAME

CROSS REFERENCE TO RELATED APPLICATIONS

This is a Non-Provisional application claiming prior benefit to U.S. Provisional Application No. 62/427,710, filed Nov. 29, 2016.

BACKGROUND

Technologies improving the miniaturization of integrated circuit chips have advanced in response to the increasing demands for downsizing, applicability to microelectronics product functionality. Ultrasonic sensing, a modality of biometric technologies that operates on sound wave, pulse echo, etc. as a medium to sense and detect biomolecules, is an exemplar application area where the supply for miniaturized integrated circuits chips is in higher demand. In this stream of technological development, ultrasonic sensing can deliver satisfactory biometric results on levels including dermis imaging and subcutaneous three-dimensional imaging; all can be done without undesired concerns over dirt or water contamination. When compared against other biometric modalities, the deeper limit of resolution achievable by ultrasonic sensors earns this biometric structure its name as the most accurate biometric technology.

Ultrasonic sensors are a type of sensors for which small size is considered to be a crucial form factor. As such, in making semiconductor integrated circuits for ultrasonic sensors, there is a continued need to resolve the challenge in their fabrication due to long electrical transmission path between piezoelectric array and application-specific integrated circuit (ASIC) through wire bond and PCB routing, multiple layouts for piezoelectric array to ASIC connection, or large gap between cover layer and sensor due to wire bond mold.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A to FIG. 5D are schematic diagrams illustrating a sensing element in accordance with some embodiments of the present disclosure.

Figure 1A:
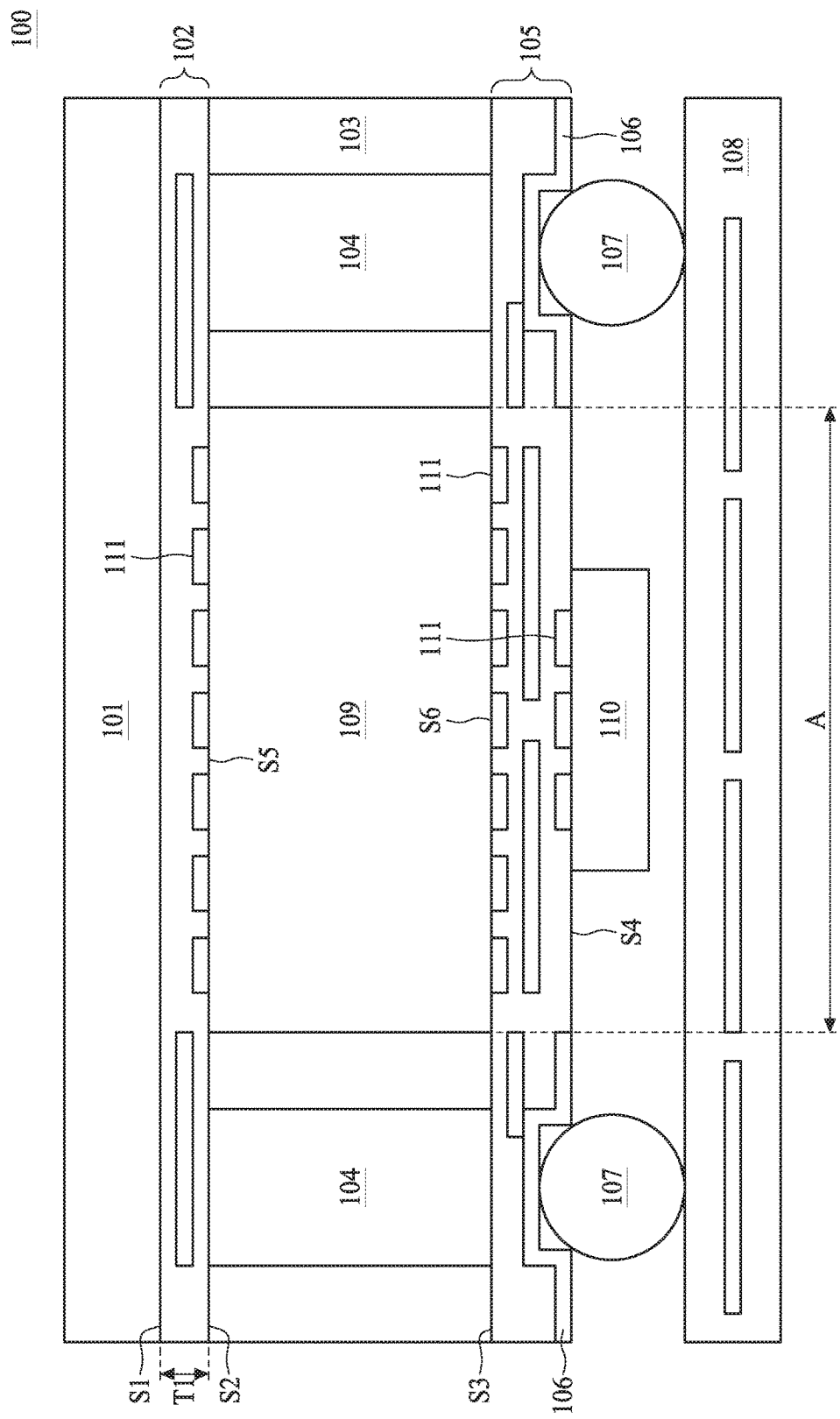
FIG. 1A is a schematic diagram illustrating an aspect of a semiconductor structure in accordance with some embodiments of the present disclosure.

The various features disclosed in the drawings briefly described above will become more apparent to one of ordinary skill in the art upon reading the detailed description below. Where features depicted in the various figures are common between two or more figures, the same identifying numerals have been used for clarity of description.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, especially relative terms, such as "beneath," "below," "lower," "above," "upper" and the like, may be used herein for eases of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In typical configuration of a semiconductor package electrically connected to a carrier such as a printed circuit board (PCB), the ASIC and the piezoelectric array of the semiconductor package are laterally disposed on a surface of the PCB, which electrically connects the ASIC and the piezoelectric array. In this configuration, a gap above the piezoelectric array must be purposefully left out in order to accommodate for wire bonding, which is a typical mechanism for electrically connecting the piezoelectric array and ASIC.

A great variety of electrical connection of semiconductor components may be used to package an integrated circuit and sensing elements, such as piezoelectric array, to minimize the form volume of the semiconductor structure, while also reducing carrier (e.g. PCB, etc.) layout. For instance, the wire bonding that typically extends from the piezoelectric array to reach the carrier is saved from occupying the neighboring space adjacent to the piezoelectric array, by sandwiching a front side redistribution layer between the cover layer and the piezoelectric array, a back side redistribution layer between the piezoelectric array and the ASIC. In another aspect of the electrical connection of semiconductor components, to shorten the transmission path between a sensing target and the piezoelectric array, the cover layer, typically disposed in separate and vertically away from the piezoelectric array, is attached with a front surface of the front side distribution layer, and a back surface opposite to the front surface is attached with a piezoelectric array. The ASIC, typically disposed in separate and horizontally away from the piezoelectric array, is attached with a back surface of the back side redistribution layer. A front surface of the back side redistribution layer, opposite to the back surface of the back side redistribution layer, is attached with the piezoelectric array. A through via electrically connects, or couples, the front side redistribution layer and the back side redistribution layer.

Sensitivity of the semiconductor structure for ultrasonic sensing applications can be enhanced because of a shorter transmission path (for instance, approximately 20 µm) between piezoelectric array and ASIC through disposition of redistribution layer and through via.

FIG. 1A is an embodiment of a semiconductor structure 100. The semiconductor structure 100 includes a carrier 108. In some embodiments, the carrier 108 is a circuit board including some circuits for electrical connection of components thereon. In some embodiments, the circuit board is a printed circuit board (PCB). In some embodiments, the carrier 108 includes silicon, ceramic, copper or etc. In some embodiments, the carrier 108 is in a rectangular shape. In some embodiments, the carrier 108 is a wafer which would be fabricated to become integrated circuits (IC) in subsequent manufacturing operations.

In some embodiments, the carrier 108 is configured for electrically connecting with several conductive bumps 107. In some embodiments, the conductive bumps 107 are solderable materials such as SnPb. In some embodiments, each conductive bump 107 is a solder bump, solder ball, solder paste or etc. In some embodiments, each of the conductive bumps 107 is in an oval shape, a spherical shape, or etc. The conductive bumps 107 are configured to electrically couple pads on a package opposite to the carrier 108 and the carrier 108.

In some embodiments, the semiconductor structure 100 includes a sensing element 109. In some embodiments, the sensing element 109 includes piezoelectric materials such as lead zirconate titanate crystals, and is fabricated with a predetermined structural array within the sensing element 109. In some embodiments, the sensing element 109 is in a quadrilateral, a rectangular or a square shape. In some embodiments, the sensing element 109 includes piezoelectric material. In further embodiments, the sensing element 109 includes piezoelectric pillars, and each has a width, for example, of about 10 mm to 50 mm. In some embodiments, a surface S2 of a front side redistribution layer 102 is attached to a top surface of the sensing element 109, and a surface S3 of the back side redistribution layer 105 is attached to a bottom surface of the sensing element 109 opposite to the top surface. Detailed structure of the sensing element 109 can be referred to the description of FIG. 4A to FIG. 4B and FIG. 5A to FIG. 5D of the present disclosure.

In some embodiments, the sensing element 109 is surrounded by a molding 103. The molding 103 is can be made of an epoxy material. In some embodiments, a through vias 104 is disposed in and penetrate through the molding 103.

In some embodiments, a front side redistribution layer 102 is disposed at a front side S5 of the sensing element 109. In some embodiments, the sensing element 109 is configured to receive a signal transmitted or reflected from a sensing target (not shown). For example, the sensing target could be placed at a side close to the front side S5 and transmit or reflect ultrasonic waves toward the front side S5 of the sensing element 109. In some embodiments, the surface S2 of the front side redistribution layer 102 is disposed and in contact with the sensing element 109, the molding 103, and the through vias 104.

In some embodiments, the back side redistribution layer 105 is disposed at a back side S6 of the sensing element 109. In some embodiments, the front side redistribution layer 102 and the back side redistribution layer 105 are electrically connected or coupled by the through vias 104. The front side redistribution layer 102 and the back side redistribution layer 105 contain metal pick-ups 111 connected to metal pads (not shown) on the front side S5 or back side S6 of the sensing element 109, transmitting electrical signal generated from the sensing element 109 in response to the sensing target.

In some embodiments, the back side redistribution layer 105 has a surface S4. The conductive bumps 107 are electrically connected with the second surface S4 of the back side redistribution layer 105. In some embodiments, the back side redistribution layer 105 has an under bump structure (UBM) 106 over the surface S4, and the conductive bumps 107 are electrically connected with the surface S4 of the back side redistribution layer 105 through the UBM 106.

In some embodiments, the semiconductor structure 100 further includes an integrated circuit chip 110 over the back side redistribution layer 105. In some embodiments, the integrated circuit chip 110 may be an application-specific integrated circuit (ASIC). ASIC refers to a variety of integrated circuit (IC) styles that vary in degree of customizability, including standard cells, which are completely customizable, and gate arrays, which are partially customizable. Each ASIC includes a customized interconnect structure that mandates a unique construction for a specific application. In some embodiments, the ASIC can be a pre-packaged silicon die. In some embodiments, the ASIC is a memory or a processor. In some embodiments the integrated circuit chip 110 or the ASIC is electrically connected or coupled with, e.g., a front side S5 of the sensing element 109 by the through via 104. In other embodiments, the integrated circuit chip 110 or the ASIC is electrically connected to or coupled with a back side S6 of the sensing element 109 by the metal pick-ups 111. For example, the metal pick-ups 111 of the back side redistribution layer 105 connect to metal pads (not shown) on the integrated circuit chip 110. Sensing signal generated in the sensing element 109 is inputted to the integrated circuit chip 110 or the ASIC for further processing. The integrated circuit chip 110 may be disposed under a projected area A of the sensing element 109, as illustrated in FIG. 1A.

In some embodiments, the semiconductor structure 100 further includes a cover layer 101 covering the front side redistribution layer 102. In some embodiments, the cover layer 101 can be made of materials transparent to ultrasonic wave or visible light configured to be sensed, such as a glass transparent to both the aforesaid ultrasonic wave and visible light, or an organic material transparent to the aforesaid ultrasonic wave, or both the aforesaid ultrasonic wave and visible light. The cover layer 101 is disposed over a first surface S1 of the front side redistribution layer 102. In some embodiments, the cover layer 101 is attached to the first surface S1 of the front side redistribution layer 102. In embodiments where the semiconductor structure 100 includes the sensing element 109 capable of transmitting or sensing ultrasonic waves, the cover layer 101 can allow the ultrasonic waves to enter, propagate, or exit the cover layer 101.

In some embodiments, the front side redistribution layer 102 or the back side redistribution layer 105 includes copper interconnects and polymeric dielectric material. In some embodiments, a thickness T1 of the front side redistribution layer 102 is equal to or less than 20 μm. In another aspect of the semiconductor structure 100, a separation between the front side S5 of the sensing element 109 and the cover layer 101 is equal to or less than 20 μm, as opposed to the conventional structure where the separation between the front side S5 of the sensing element 109 and the cover layer 101 exceeds 70 μm for the sake of accommodating wire bonding structure, as previously discussed.

As shown in FIG. 1A, the semiconductor structure 100 may further include the conductive bumps 107 which are attached to the back side redistribution layer 105 through UBM 106.

Figure 1B:
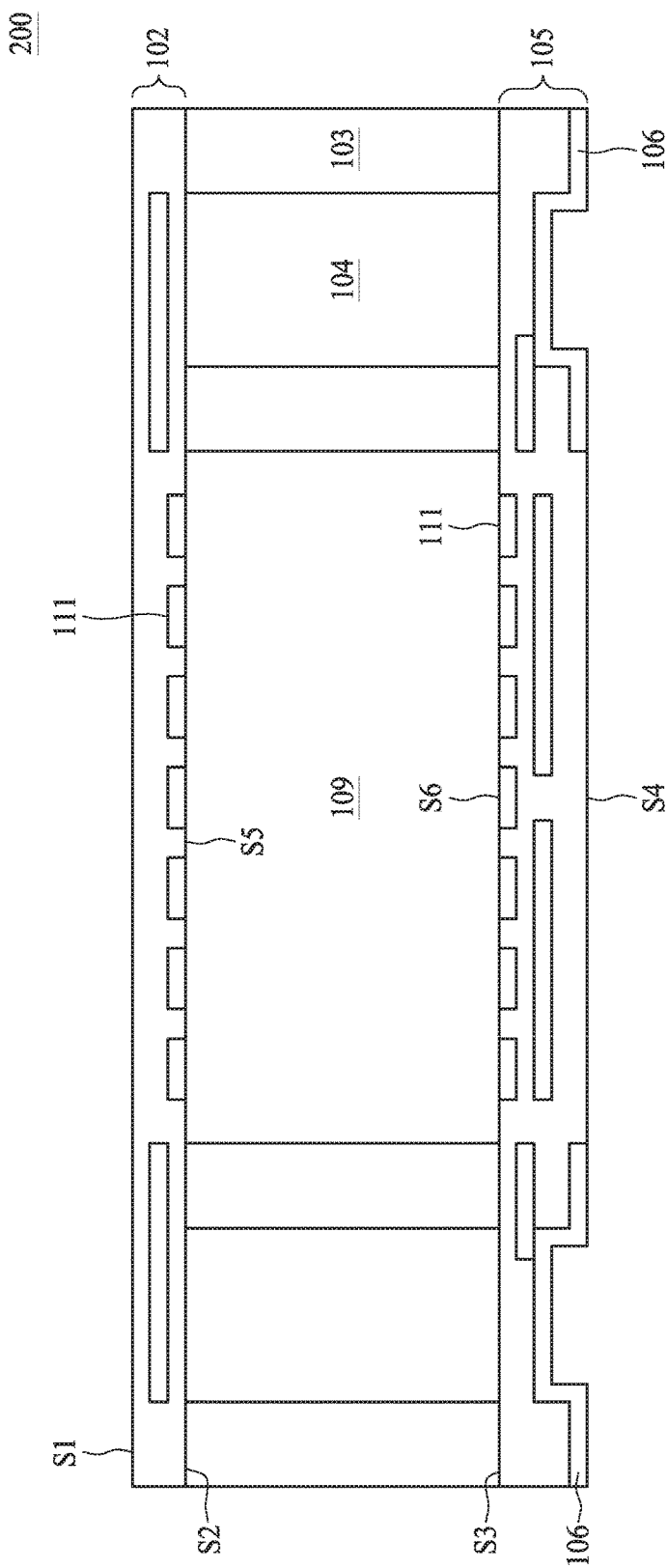
FIG. 1B is a schematic diagram illustrating another aspect of a semiconductor structure in accordance with some embodiments of the present disclosure.

Referring now to FIG. 1B, a semiconductor structure 200 is presented. The semiconductor structure 200 features the same components and configuration as described for the semiconductor structure 100 as shown in FIG. 1A, but differs from the semiconductor structure 100 at least in the way that the cover layer, the integrated circuit chip, the conductive bumps, and the carrier are omitted. In some embodiments, the structure of the semiconductor structure 200 can be used to detect a sensing target that is positioned near the first surface of the front side redistribution layer, or near the second surface of the back side redistribution layer 105.

In some embodiments, the semiconductor structure 200 can be electrically connected to an integrated circuit chip by suitable electrical connections. In some embodiments, the semiconductor structure 200 and the integrated circuit chip are disposed over a carrier. In some embodiments, the semiconductor structure 200 is of a circular shape, an oval shape, etc., wherein the front side redistribution layer 102 forms the outermost surface area of the semiconductor structure 200 and the back side redistribution layer is not present in the semiconductor structure 200. In further embodiments, the semiconductor structure 200 has the cover layer disposed over the first surface of the front side redistribution layer.

Figure 1C:
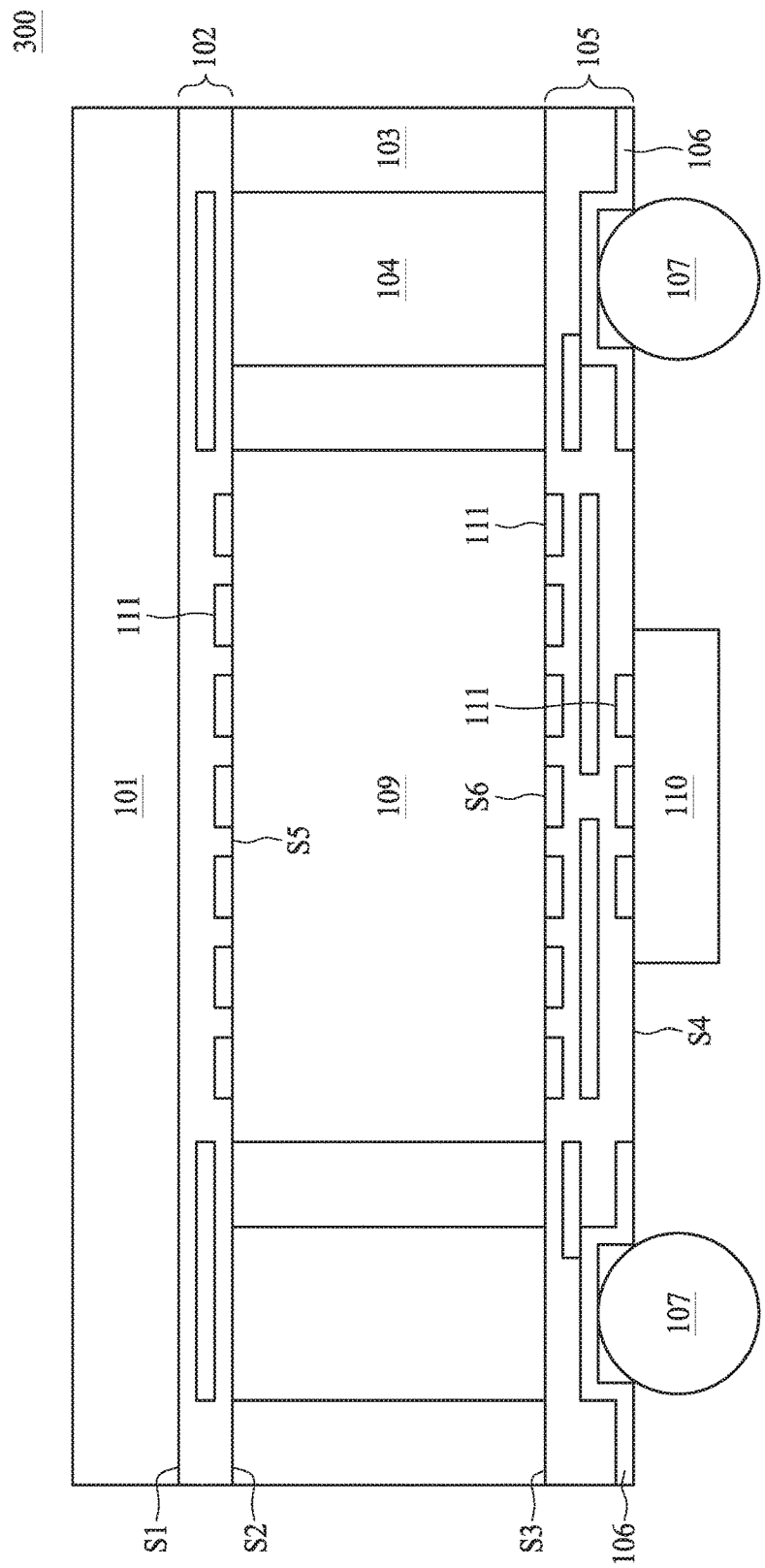
FIG. 1C is a schematic diagram illustrating yet another aspect of a semiconductor structure in accordance with some embodiments of the present disclosure.

Another embodiment of the semiconductor structure 300 is presented in FIG. 1C. The semiconductor structure 300 shows the same components and configuration as described for the semiconductor 100 as shown in FIG. 1A, but is different from the semiconductor structure 100 in the way that the semiconductor structure 300 at least does not include a carrier.

In some embodiments, the semiconductor structure 300 further includes a cover layer 101 being disposed in contact with the front side redistribution layer 102. In some embodiments, the cover layer 101 can be made of materials transparent to ultrasonic wave or visible light configured to be sensed, such as a glass transparent to both the aforesaid ultrasonic wave and visible light, or an organic material transparent to the aforesaid ultrasonic wave, or both the aforesaid ultrasonic wave and visible light. The cover layer 101 can be disposed over a first surface S1 of the front side redistribution layer 102. In some embodiments, a glass layer is attached to the first surface S1 of the front side redistribution layer 102. The cover layer can be transparent, or can be partially transparent. In embodiments where the semiconductor structure 300 includes the sensing element 109 capable of sensing ultrasonic waves, the cover layer can allow the ultrasonic waves to enter, propagate, and exit the cover layer 101.

In some embodiments, the semiconductor structure 300 further includes conductive bumps 107. The conductive bumps 107 are attached to the back side redistribution layer 105. The conductive bumps 107 is a solder bump, solder ball, solder paste or etc. in some embodiments of the semiconductor structure 300.

The semiconductor structures 100, 200, 300 of FIG. 1A, 1B, 1C, or some other embodiments can be configured for a predetermined application, including an intended use for biometric applications.

Figure 2:
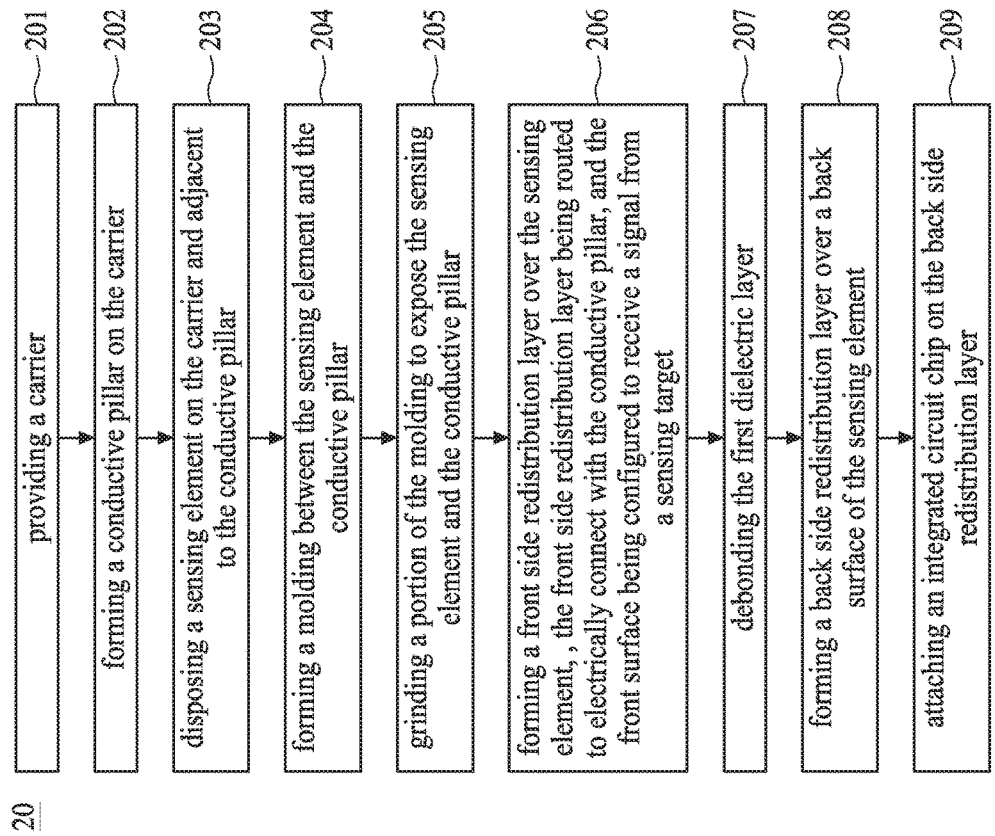
FIG. 2 is a flow diagram of a method of manufacturing a semiconductor structure in accordance with some embodiments of the present disclosure.

FIG. 2 is an embodiment of a method 20 of manufacturing a semiconductor structure. The method 20 includes a number of operations (201, 202, 203, 204, 205, 206, 207, 208, and 209). Operations of FIG. 2 are exemplified by cross sectional views shown in FIG. 3A to FIG. 3K. In the following disclosure, operations of FIG. 2 are described along with FIG. 3A to FIG. 3K.

Figure 3A:
FIGS. 3A to 3K are cross sectional views of a semiconductor structure in various operations of manufacturing, in accordance with some embodiments of the present disclosure.

In operation 201, a first dielectric layer 112 is provided as shown in FIG. 3A. In some embodiments, the first dielectric layer 112 is formed by a dielectric material or a polymeric material. In some embodiments, the providing the first dielectric layer 112 includes providing depositing polymeric materials over a temporary carrier 130. In some embodiments, the carrier 130 can be a 12-inch glass carrier.

Figure 3B:
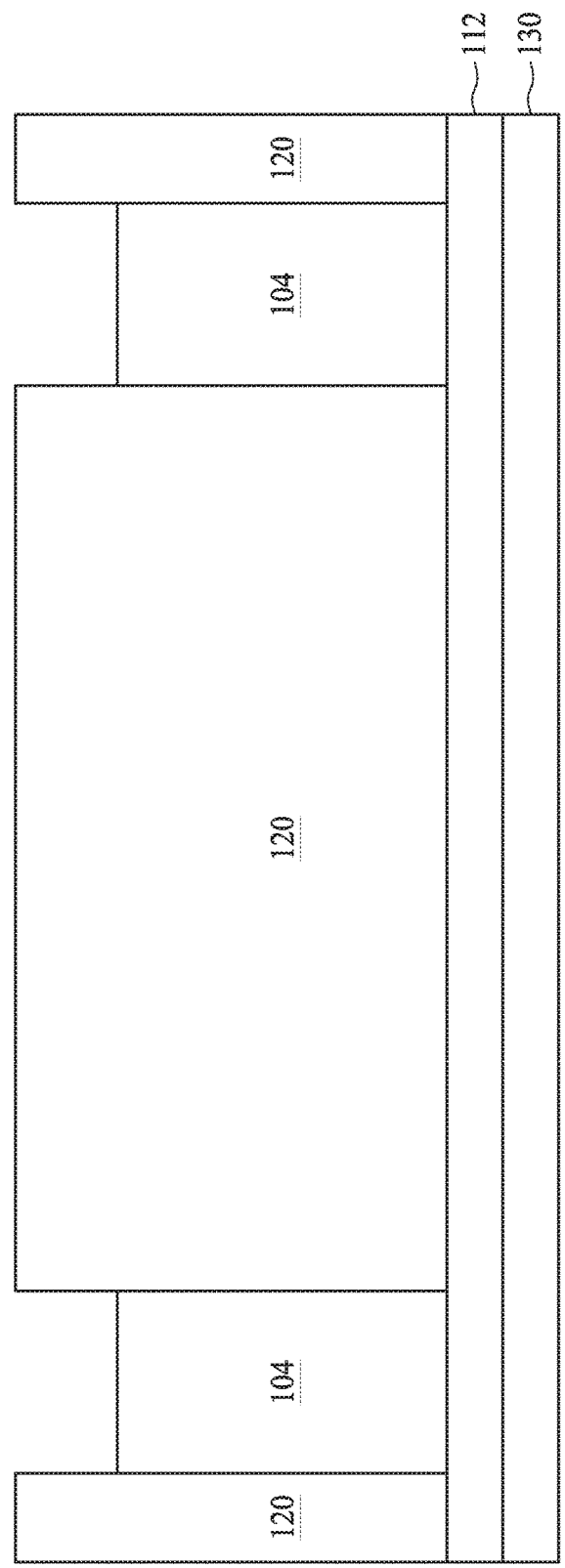

In operation 202, conductive pillars, which, after the subsequent operations, become through vias 104, are formed on the first dielectric layer 112 as shown in FIG. 3B. Since the as-formed conductive pillars are not surrounded by moldings so as to appear as "through vias", for consistency, the present disclosure refers these as-formed conductive pillars as "through vias 104". In some embodiments, the through vias 104 are formed of an electrically conductive material such as copper. In some embodiments, the forming of the through vias 104 on the first dielectric layer 112 includes a photoresist 120 patterning operation over the first dielectric layer 112 and an electroplating operation filling the photoresist 120 openings over the first dielectric layer 112. A removal and cleaning of the photoresist 120 is conducted after the electroplating operation.

Figure 3C:
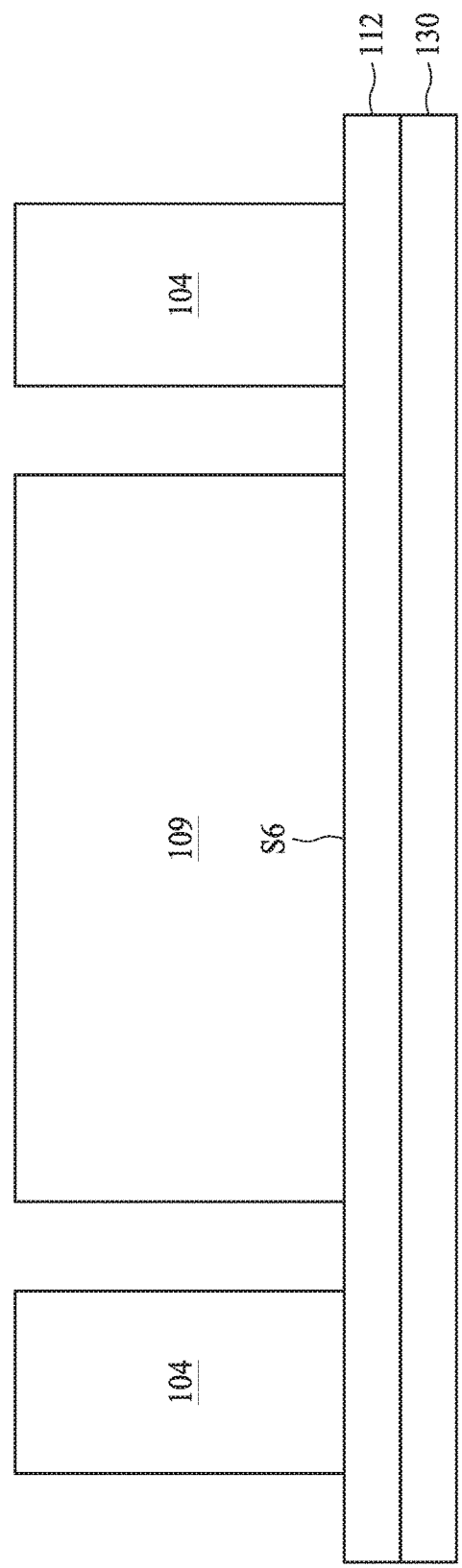

In operation 203, a sensing element 109 is disposed on the first dielectric layer 112 and adjacent to the through vias 104 as shown in FIG. 3C. In some embodiments, a back side S6 of the sensing element 109 is attached on the first dielectric layer 112. In some embodiments, the disposing the sensing element 109 between the through vias 104 as shown in FIG. 3B is done in a pick and place manner.

Figure 3D:
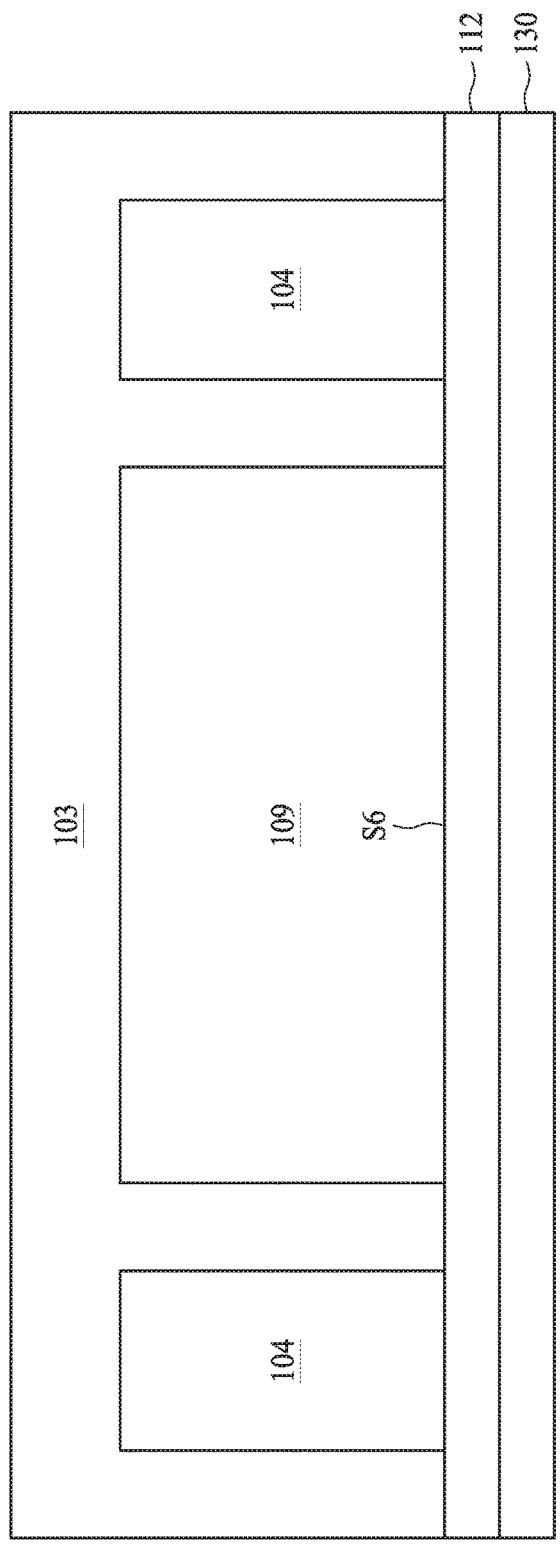

In operation 204, a molding 103 is formed to surround the sensing element 109 and the through vias 104 as shown in FIG. 3D.

Figure 3E:
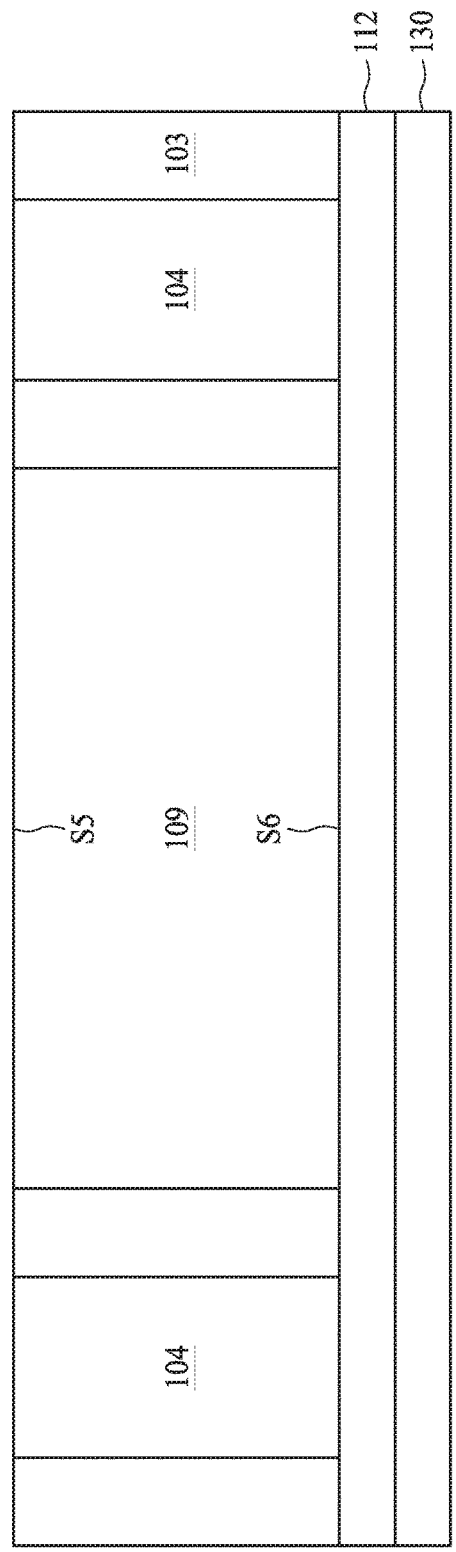

In operation 205, a portion of the molding 103 is grinded to expose a front surface S5 of the sensing element 109 and a top of the through vias 104 as shown in FIG. 3E. In some embodiments, the grinding operation includes chemical mechanical polishing.

Figure 3F:
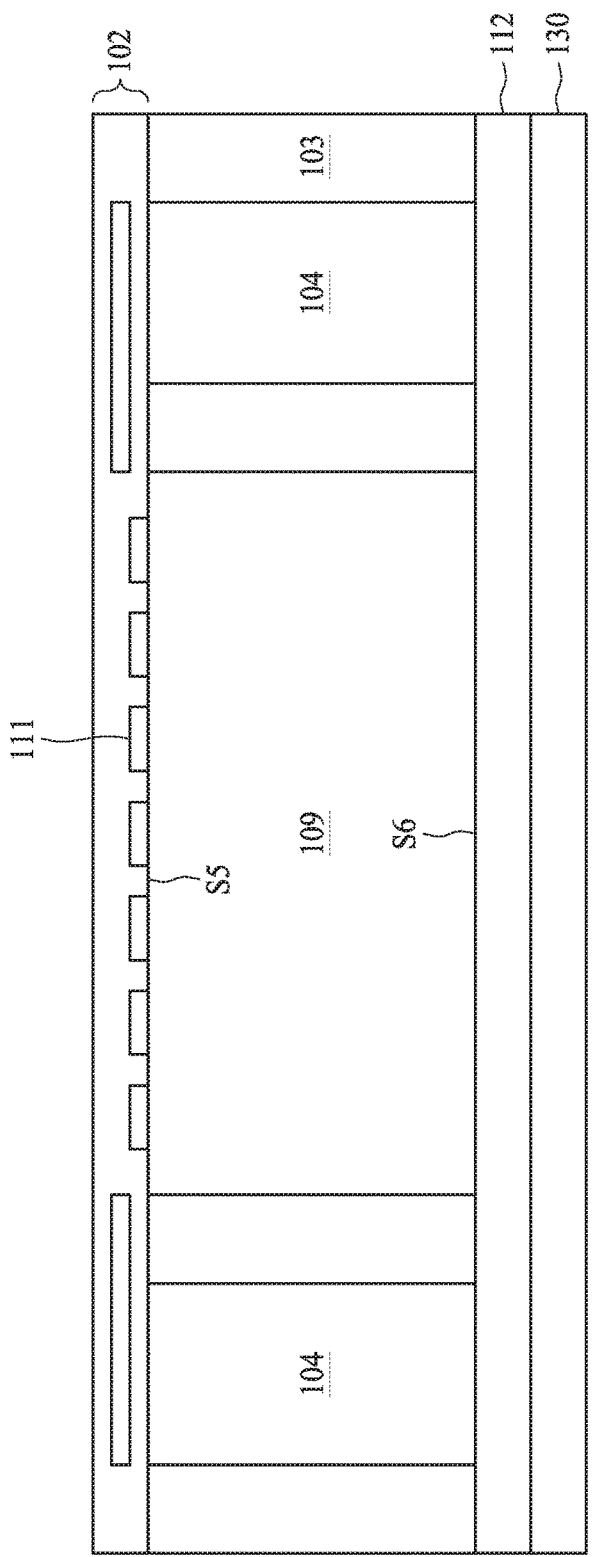

In operation 206, a front side redistribution layer 102 is formed over a front side S5 of the sensing element 109 as shown in FIG. 3F. In some embodiments, the front side redistribution layer 102 is formed to pick up electrical signal generated in the sensing element 109. Metal pick-ups 111 are formed in the front side redistribution layer 102. In other words, the meal pick-ups 111 are electrically coupled to metal pads (not shown) on the front side S5 of the sensing element 109 and re-route the signal line in the front side redistribution layer 102 according to different designs. In some embodiments, the front side redistribution layer 102 is laterally extended over the through vias 104 and the molding 103.

Figure 3G:
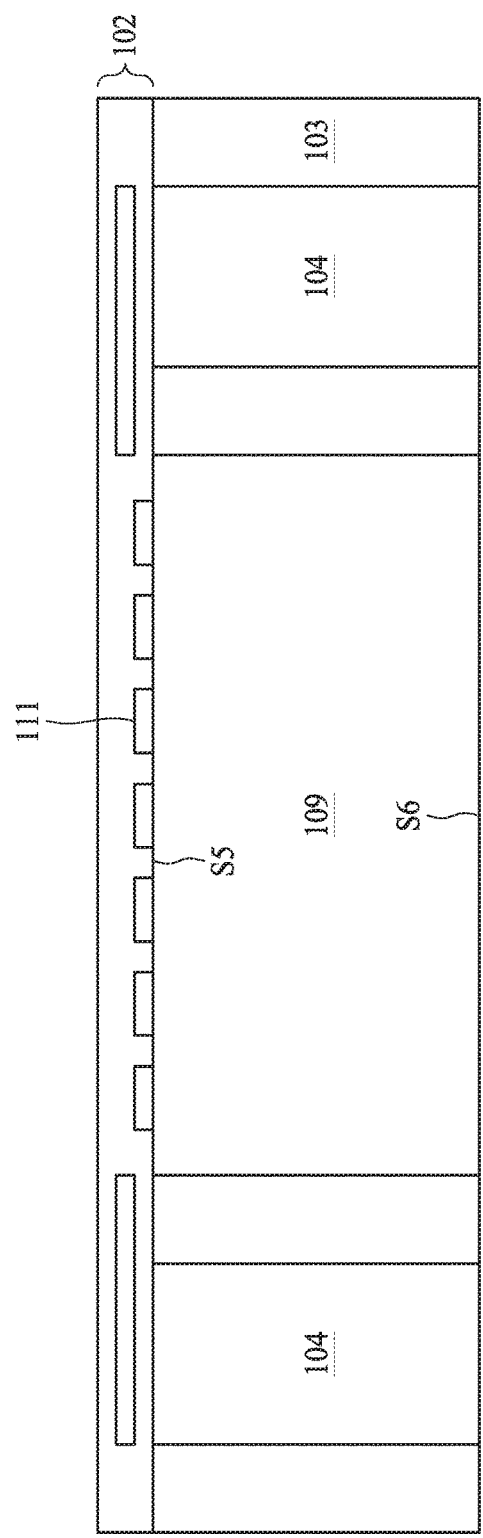
Figure 3H:
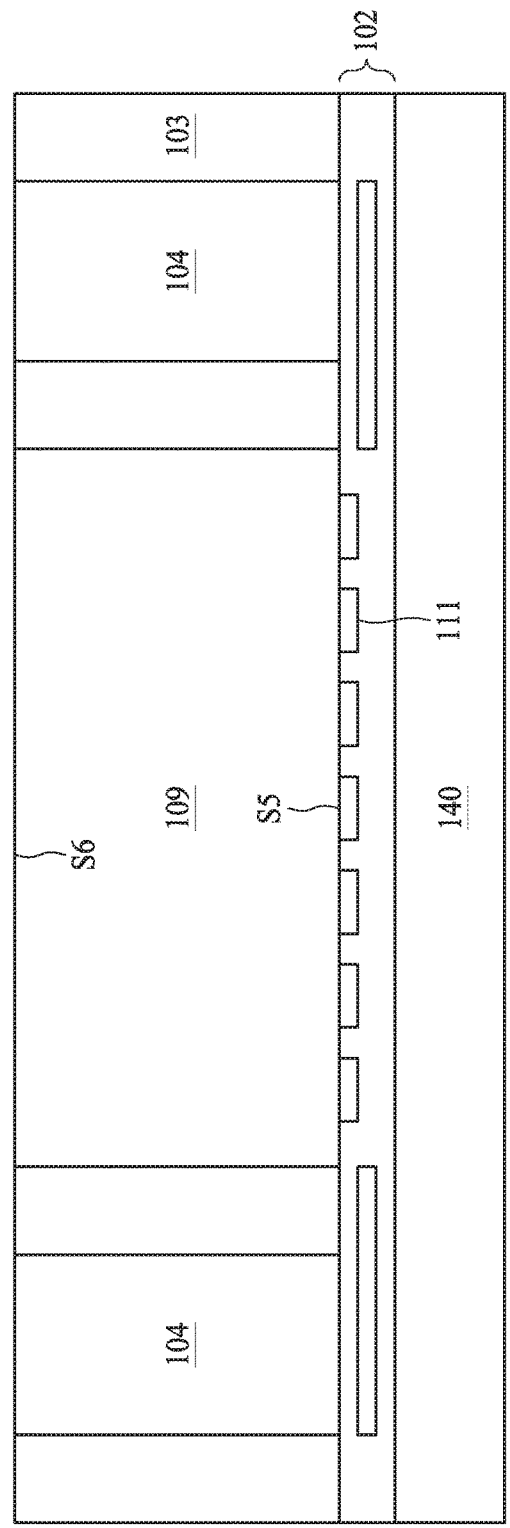

In operation 207, the carrier 108 is debonded from a back side S6 of the sensing element 109 as shown in FIG. 3G. In some embodiments, the carrier 130 is debonded from the back side S6 of the sensing element 109 by chemical means to dissolve the first dielectric layer 112 or in some embodiments, polymeric materials.

Following the debonding operation, the sensing element 109, through vias 104, molding 103, and the front side redistribution layer 102 are flipped over so that the debonded side faces upward for subsequent fabrication. In some embodiments, the debonded surface is the back side S6 of the sensing element 109.

Figure 3I:
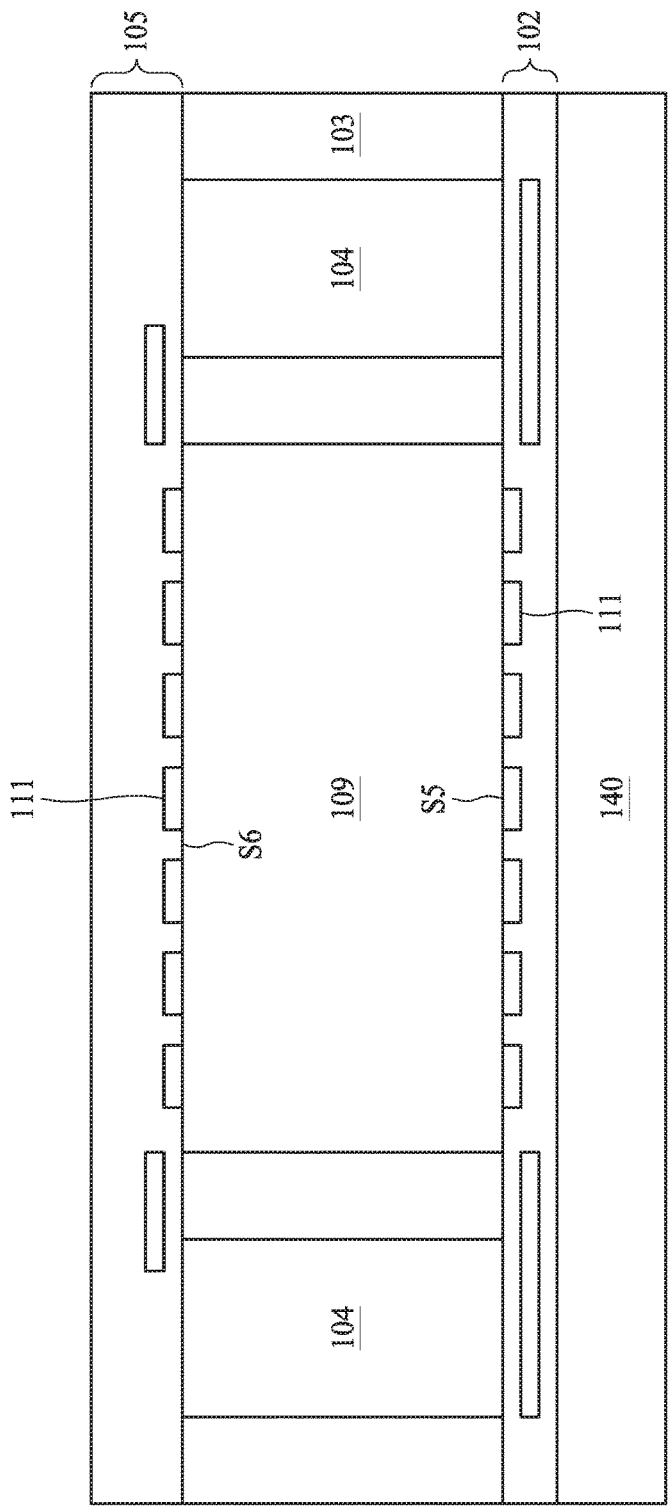

In operation 208, a back side redistribution layer 105 is formed over the debonded surface or the back side S6 of the sensing element 109 as shown in FIG. 3I. During the formation of the back side redistribution layer 105, metal pick-ups 111 are formed in the back side redistribution layer 105. Alternatively speaking, the metal pick-ups 111 are electrically coupled to the sensing element 109 and re-route the signal line in the back side redistribution layer 105 depending on variations in the design specification. In some embodiments, the back side redistribution layer 105 is formed over the through vias 104 and laterally extending over the molding 103.

Figure 3J:
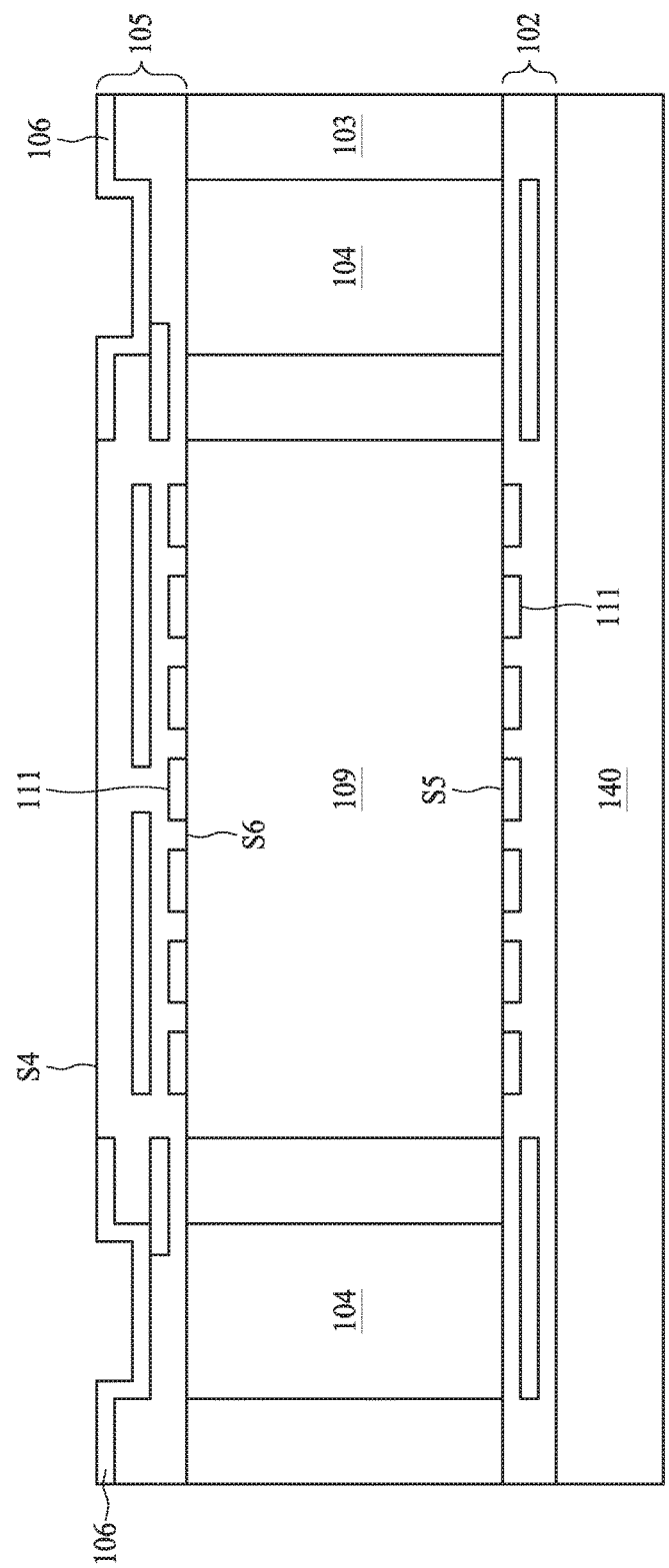

In some embodiments, a UBM 106 is formed over a second surface S4 of the back side redistribution layer 105, as shown in FIG. 3J. Although not illustrated in FIG. 3J, the UBM 106 forms electrical connection to the signal muting (e.g., metal lines) and the metal pick-ups 111 in the back side redistribution layer 105. For example, the UBM 106 conforms to a recess profile in the dielectric portion of the back side redistribution layer 105 and connecting with the underlying signal routing. In some embodiments, the conductive bumps 107 are disposed on the UBM 106, and are arranged in an array or matrix to become a ball grid array (BGA) package. In some embodiments, the portion of the UBM 106 conforming to the recess profile of the dielectric portion is configured to receive the conductive bumps 107, as shown in FIG. 3K.

Figure 3K:
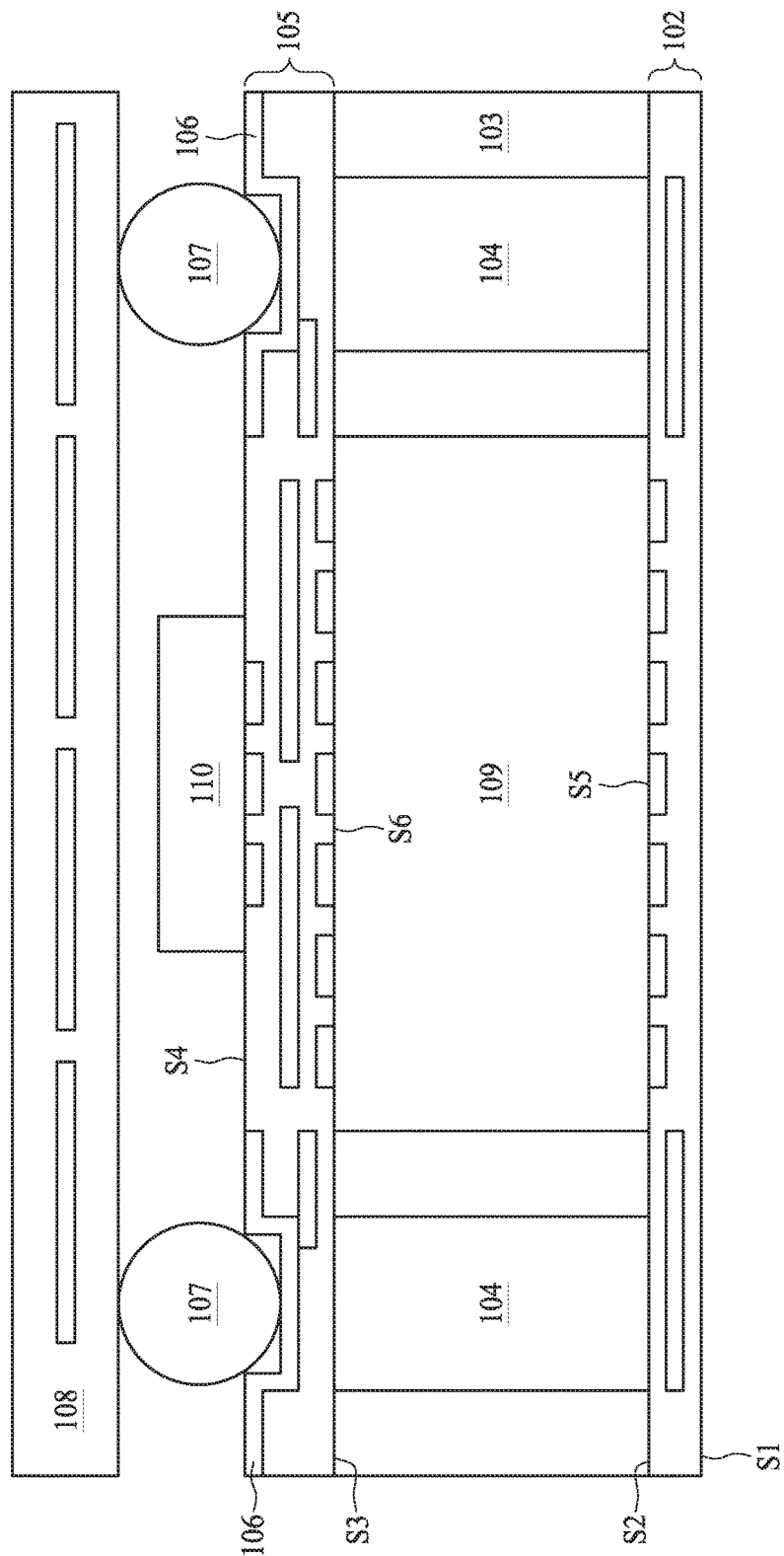

In operation 209, an integrated circuit chip 110 is attached to a second surface S4 of the back side redistribution layer 105, as shown in FIG. 3K. In some embodiments, the integrated circuit chip 110 is an application-specific integrated circuit (ASIC). In some embodiments, the ASIC can be a pre-packaged silicon die. In some embodiments, the ASIC is a memory or a processor.

Figure 4A:
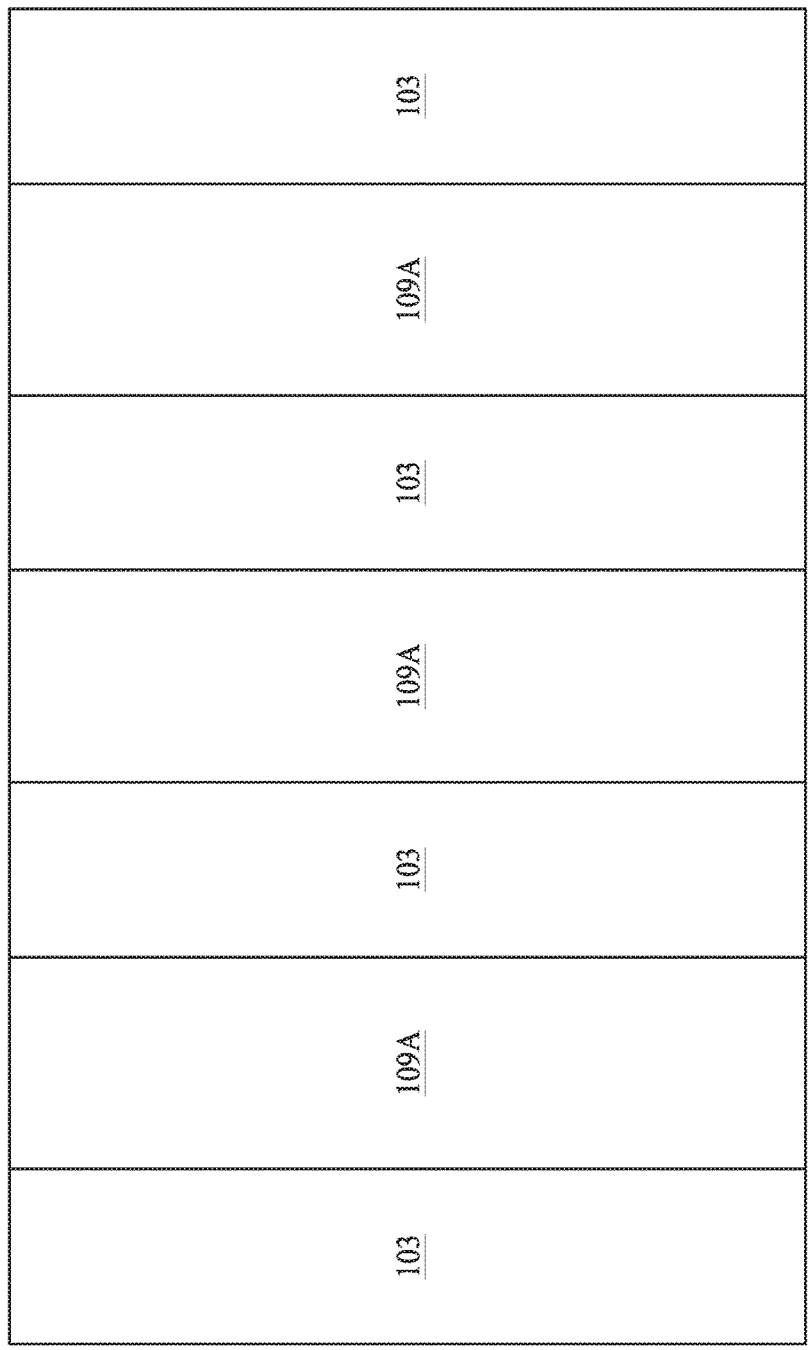
FIG. 4A is a side view of a sensing element in accordance with some embodiments of the present disclosure.

Referring to FIG. 4A, FIG. 4A is a side view of the sensing element 109 of the semiconductor structure 100, 200, or 300, including sensing pillars 109A in accordance with some embodiments of the present disclosure. The sensing pillars 109A are mutually spaced apart by a fixed distance D1, as shown in a top-down view of the sensing element 109 in FIG. 4B. In an embodiment where the sensing elements including sensing pillars 109A, each sensing pillar 109A is surrounded by the molding 103. In some embodiments, each sensing pillar 109A is composed of piezoelectric material.

Figure 4B:
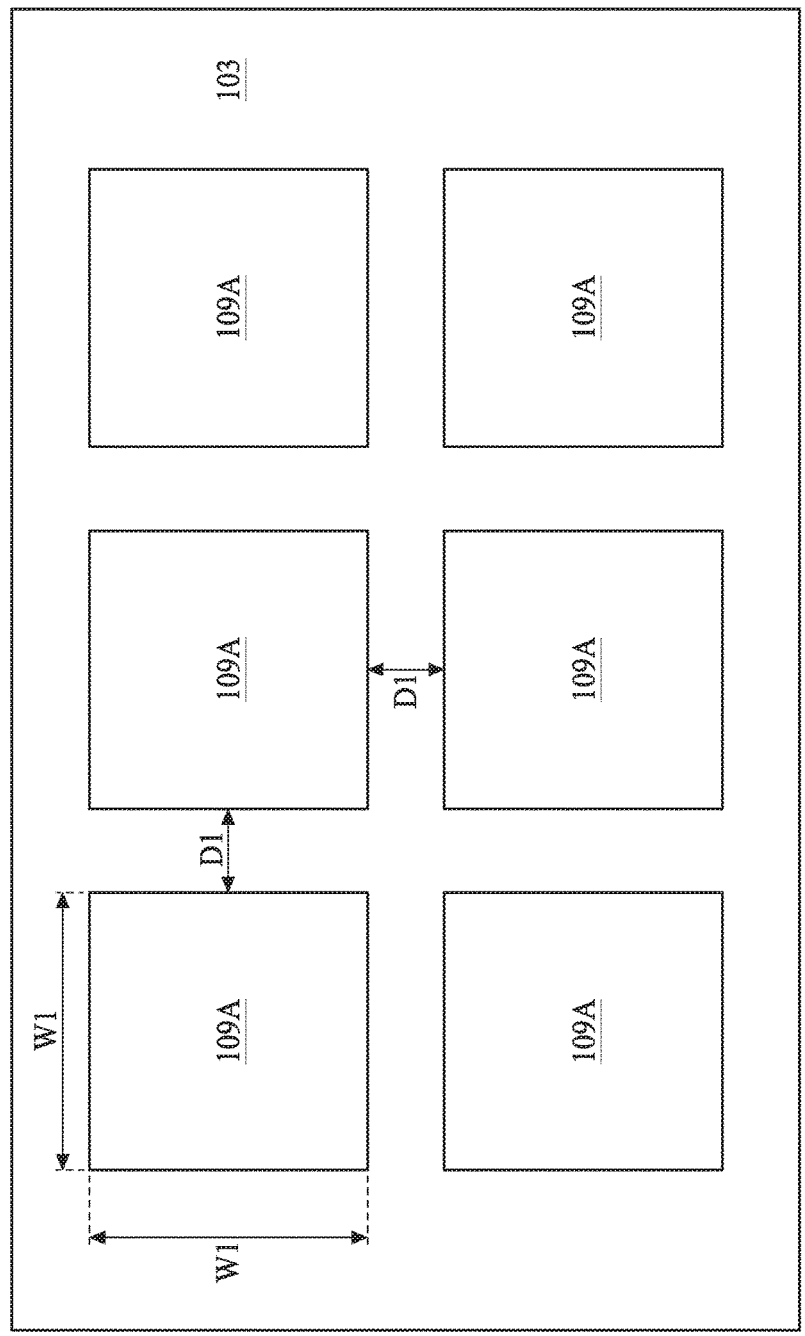
FIG. 4B is a top-down view of a sensing element in accordance with some embodiments of the present disclosure.

Referring to FIG. 4B, FIG. 4B is a top-down view of sensing pillars 109A in accordance with some embodiments of the present disclosure. A top surface of each sensing pillar 109A is exposed from the molding 103 and surrounded by the molding 103 at four sides thereof. In some embodiments, the molding 103 includes an epoxy material. In some embodiments, each sensing pillar 109A has a tetragonal shape, for example, a square shape having a side width W1. In some further embodiments, the W1 is about 40 μm. In some embodiments, a plurality of the sensing pillars 109A are appeared to be surrounded by the molding 103, and adjacent two of the sensing pillars 109A are spaced apart by a fixed distance D1 inside the molding 103. In certain embodiments, the fixed distance D1 may be 10 μm, and the sensing pillars 109A disposed nearest an edge of the molding 103 may be disposed away from the nearest edge of the molding 103 by about 50 μm. In some embodiments, the sensing element 109 can include up to a total of 14,400 piezoelectric sensing pillars 109A, arranged in a pillar count of 180 piezoelectric pillars in length, and 80 piezoelectric pillars in width. In some embodiments, from a top-down view, a cross sectional area of the sensing element 109 has an area of 36 mm$^2$, with a dimension of 4 mm in length and 9 mm in width. In some embodiments, each of the sensing pillars 109A share the same cross sectional area; in some embodiments, each of the sensing pillars 109A can differ from each other by a different cross sectional area.

A method of manufacturing the sensing pillars 109A as shown in FIG. 4A and FIG. 4B is presented in FIG. 5A through FIG. 5D.

Referring now to FIG. 5A, FIG. 5A shows a side-view cross section of a piezoelectric wafer 109'. A plurality of sensing pillars 109A are formed starting from the piezoelectric wafer 109'.

Referring next to FIG. 5B, the piezoelectric wafer 109' is patterned to form protrusions 109A' by a mechanical operation such as sawing. In some embodiments, a plurality of protrusions 109A' are formed from a sawing operation applied to one surface of the piezoelectric wafer 109'.

Figure 5C:
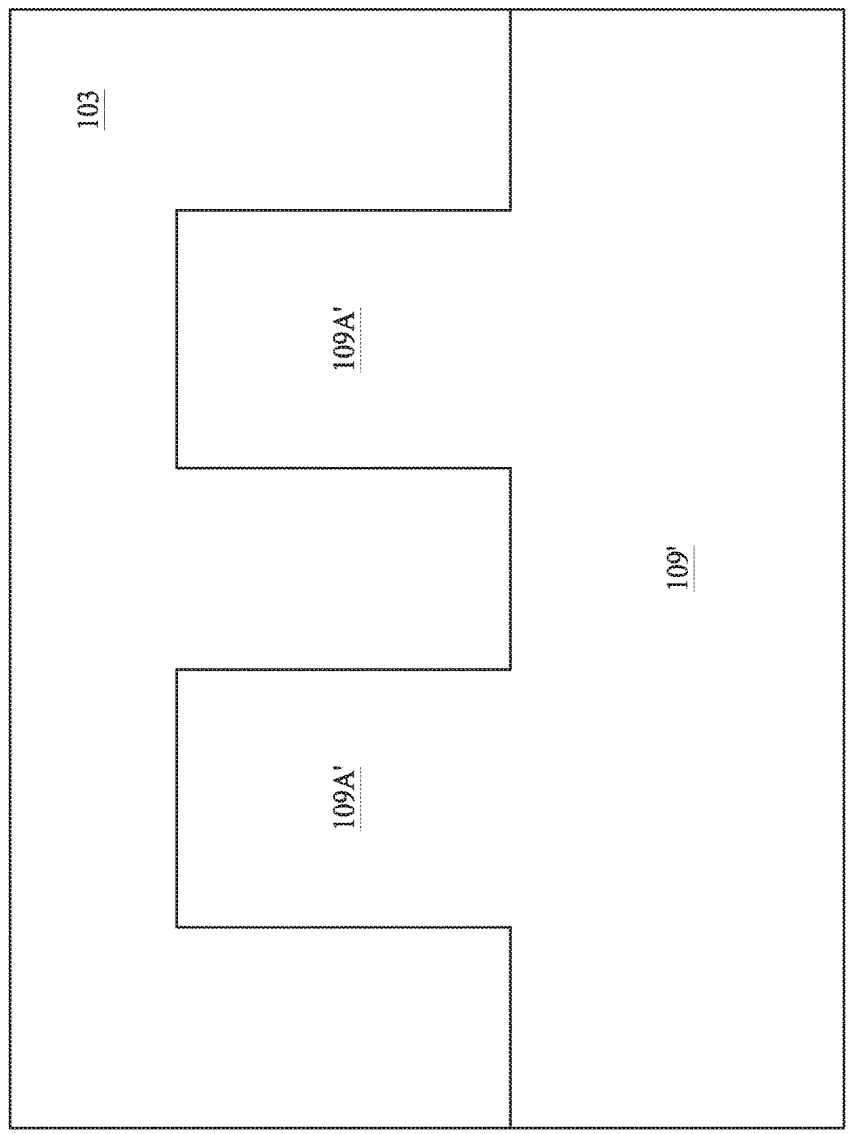

Referring to FIG. 5C, a molding 103 is formed over the protrusions 109A'. The molding compound is filled into the space between adjacent protrusions 109A' to cover the top surface profile of the piezoelectric wafer 109'.

Figure 5D:
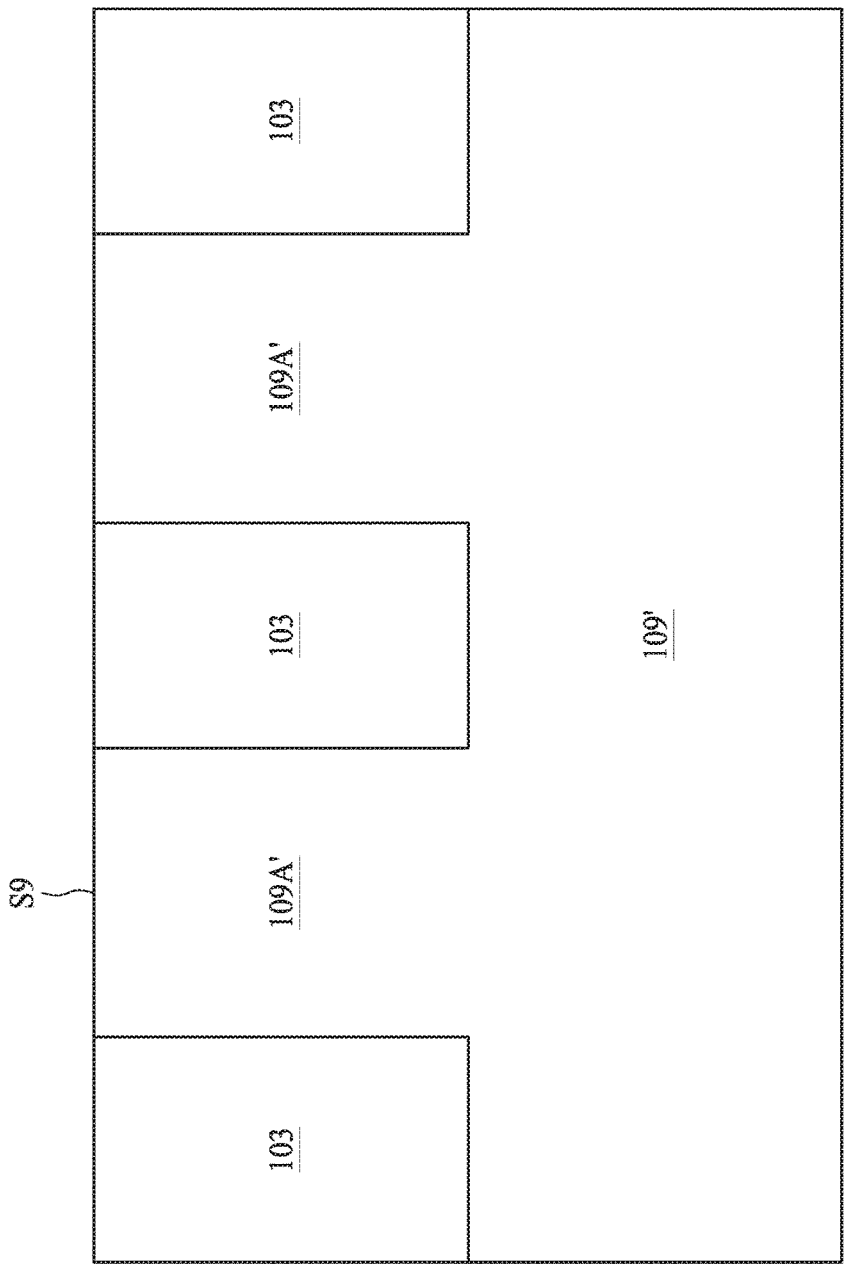

Referring to FIG. 5D, a portion of the molding 103 is removed by a mechanical operation, such as grinding, so as to expose a surface S9 of the protrusions 109A'.

After the grinding operation shown in FIG. 5D is completed, the piezoelectric wafer 109' in FIG. 5D is flipped upside-down and a subsequent grinding operation is conducted to remove the portion of the piezoelectric wafer 109' connecting protrusions 109A'. As such, a sensing pillar 109A-moldings 103 lateral stacking composites are formed, as depicted and discussed in FIG. 4A.

In some embodiments, a semiconductor structure includes a sensing element configured to receive a signal from a sensing target, a molding surrounding the sensing element, a through via in the molding, a front side redistribution layer disposed at a front side of the sensing element and electrically connected thereto, and a back side redistribution layer disposed at a back side of the sensing element, the front side redistribution layer and the back side redistribution layer are electrically connected by the through via.

In some embodiments, the semiconductor structure further comprises an application-specific integrated circuit (ASIC) over the back side redistribution layer, the ASIC being electrically connected with the sensing element by the through via. In some embodiments, the front side redistribution layer or the back side redistribution layer comprises copper wire. In some embodiments, a thickness of the front side redistribution layer is equal to or less than 20 μm. In some embodiments, the semiconductor structure further comprises a cover layer in contact with the front side redistribution layer. In some embodiments, the cover layer is a glass having a predetermined transmittance ratio. In some embodiments, the molding comprises epoxy material. In some embodiments, the semiconductor structure further comprises solder bumps attached to the back side redistribution layer. In some embodiments, the sensing element comprises piezoelectric pillars. In some embodiments, the ASIC is under a projected area of the sensing element.

In some embodiments, a semiconductor structure includes a sensing element having a front side and a back side opposing to the front side, a front side redistribution layer disposed at the front surface, a back side redistribution layer disposed at the back surface, a molding surrounding the sensing element, a through via extending through the molding, and electrically coupling the front side redistribution layer and the back side redistribution layer. In some embodiments, the semiconductor structure comprises an integrated circuit chip. In some embodiments, the integrated circuit is disposed over the back side redistribution layer, and stacked over the sensing element.

In some embodiments, the integrated circuit chip comprises an application-specific integrated circuit (ASIC). In some embodiments, the front side redistribution layer or the back side redistribution layer comprise polymeric dielectric material. In some embodiments, a thickness of the front side redistribution layer is equal to or less than about 20 μm. In some embodiments, semiconductor structure further comprises a glass layer attached to a first surface of the front side redistribution layer. In some embodiments, the sensing element comprises piezoelectric material.

In some embodiments, a method of manufacturing a semiconductor structure includes providing a carrier, forming a conductive pillar on the carrier, disposing a sensing element on the carrier and adjacent to the conductive pillar. The method further includes forming a front side redistribution layer over a front surface of the sensing element, the front side redistribution layer being routed to electrically connect with the conductive pillar, and the front surface being configured to receive a signal from a sensing target. The method further includes forming a back side redistribution layer over a back surface of the sensing element.

In some embodiments, the providing the first dielectric layer comprises providing polymeric materials over a carrier. In some embodiments, the disposing the sensing element between each of the through via is done in a pick and place manner. In some embodiments, the forming the through via on the first dielectric layer comprises an electroplating operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departs from the spirit and scope of the present disclosure.

What is claimed is:

1. A semiconductor structure, comprising:
    a sensing element configured to receive a signal from a sensing target;
    a molding surrounding the sensing element;
    a through via in the molding;
    a front side redistribution layer directly contacting with a front surface of the sensing element and electrically connected thereto;
    a back side redistribution layer directly contacting with a back surface of the sensing element, wherein the front side redistribution layer and the back side redistribution layer are electrically connected by the through via; and
    an integrated circuit chip over the back side redistribution layer.

2. The semiconductor structure as set forth in claim 1, wherein the integrated circuit chip is electrically connected with the sensing element by the through via.

3. The semiconductor structure as set forth in claim 1, wherein the front side redistribution layer or the back side redistribution layer comprises copper interconnects.

4. The semiconductor structure as set forth in claim 1, wherein a thickness of the front side redistribution layer is equal to or less than 20 μm.

5. The semiconductor structure as set forth in claim 1, further comprising a cover layer covering the front side redistribution layer.

6. The semiconductor structure as set forth in claim 5 wherein the cover layer is transparent to the signal from the sensing target.

7. The semiconductor structure as set forth in claim 1, wherein the sensing element comprises piezoelectric pillars.

8. The semiconductor structure as set forth in claim 1, further comprising solder bumps attached to the back side redistribution layer.

9. The semiconductor structure as set forth in claim 1, wherein the integrated circuit chip is an application-specific integrated circuit (ASIC).

10. The semiconductor structure as set forth in claim 9, wherein the ASIC is under a projected area of the sensing element.

11. A semiconductor structure, comprising:
    a sensing element having a front side and a back side opposing to the front side
    wherein the sensing element comprises piezoelectric material;
    a front side redistribution layer disposed at the front side of the sensing element;
    a back side redistribution layer disposed at the back side of the sensing element;
    a molding surrounding the sensing element;
    a through via extending through the molding and electrically coupling the front side redistribution layer and the back side redistribution layer; and
    an integrated circuit chip,
    wherein the integrated circuit chip is disposed over the back side redistribution layer, and stacked over the sensing element.

12. The semiconductor structure as set forth in claim 11, wherein the integrated circuit chip comprises an application-specific integrated circuit (ASIC).

13. The semiconductor structure as set forth in claim 11, wherein the front side redistribution layer or the back side redistribution layer comprises polymeric dielectric material.

14. The semiconductor structure as set forth in claim 11, wherein a thickness of the front side redistribution layer is equal to or less than about 20 μm.

15. The semiconductor structure as set forth in claim 11, further comprising a glass layer attached to a first surface of the front side redistribution layer.

16. A semiconductor structure, comprising:
- a sensing element having a front side and a back side opposing to the front side;
- a molding surrounding the sensing element;
- a front side redistribution layer disposed over a front side of the sensing element and a surface of the molding;
- a back side redistribution layer disposed at a back side of the sensing element;
- an integrated circuit chip over the back side redistribution layer;
- a through via extending through the molding and electrically coupling the front side redistribution layer and the back side redistribution layer; and
- a cover layer over the front side redistribution layer, wherein a separation between a bottom of the cover layer and the front side of the sensing element is identical to the thickness of the front side redistribution layer.

17. The semiconductor structure as set forth in claim 16, wherein a thickness of the front side redistribution layer is equal to or less than 20 μm.

18. The semiconductor structure as set forth in claim 16, further comprising:
- a carrier in proximity to the back side redistribution layer, supporting the sensing element,
- wherein the integrated circuit chip is disposed between the carrier and the sensing element, and electrically coupled to the back side redistribution layer.

19. The semiconductor structure as set forth in claim 16, wherein the sensing element comprises piezoelectric pillars.

20. The semiconductor structure as set forth in claim 16, wherein a thickness of the sensing element is identical to a distance between the front side redistribution layer and the back side redistribution layer.

* * * * *